(12) United States Patent
Honda

(10) Patent No.: US 8,642,483 B2
(45) Date of Patent: Feb. 4, 2014

(54) SUBSTRATE PROCESSING WITH SHRINK ETCHING STEP

(75) Inventor: Masanobu Honda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 617 days.

(21) Appl. No.: 12/709,016

(22) Filed: Feb. 19, 2010

(65) Prior Publication Data

US 2010/0216314 A1 Aug. 26, 2010

(30) Foreign Application Priority Data

Feb. 20, 2009 (JP) .................................. 2009-038046

(51) Int. Cl.
*H01L 21/302* (2006.01)

(52) U.S. Cl.
USPC ........... 438/737; 438/694; 438/695; 438/696; 257/E21.214

(58) Field of Classification Search
USPC ........... 438/694, 695, 696, 737; 257/E21.214
See application file for complete search history.

(56) References Cited

U.S. PATENT DOCUMENTS

| | | | | |
|---|---|---|---|---|
| 4,855,017 A | * | 8/1989 | Douglas ..................... | 438/695 |
| 5,719,089 A | * | 2/1998 | Cherng et al. ............. | 438/637 |
| 5,767,018 A | * | 6/1998 | Bell .............................. | 438/696 |
| 5,880,018 A | * | 3/1999 | Boeck et al. .............. | 438/619 |
| 5,998,100 A | * | 12/1999 | Azuma et al. .............. | 430/313 |
| 6,069,091 A | * | 5/2000 | Chang et al. .............. | 438/719 |
| 6,759,340 B2 | * | 7/2004 | Nallan et al. .............. | 438/714 |
| 6,797,610 B1 | * | 9/2004 | Gambino et al. .......... | 438/637 |
| 6,890,859 B1 | * | 5/2005 | Bamnolker et al. ....... | 438/700 |
| 6,998,348 B2 | * | 2/2006 | Ciovacco et al. .......... | 438/706 |
| 7,265,060 B2 | * | 9/2007 | Tsai et al. .................. | 438/737 |
| 7,473,377 B2 | * | 1/2009 | Yamaguchi et al. ....... | 216/22 |
| 2005/0103441 A1 | * | 5/2005 | Honda et al. ............. | 156/345.47 |
| 2005/0103748 A1 | * | 5/2005 | Yamaguchi et al. ....... | 216/67 |
| 2006/0096952 A1 | * | 5/2006 | Honda ....................... | 216/67 |
| 2006/0141766 A1 | * | 6/2006 | Kim ........................... | 438/624 |
| 2007/0197040 A1 | * | 8/2007 | Kitamura et al. .......... | 438/710 |
| 2007/0212887 A1 | * | 9/2007 | Kitamura et al. .......... | 438/706 |
| 2009/0191711 A1 | * | 7/2009 | Rui et al. ................... | 438/695 |
| 2010/0105208 A1 | * | 4/2010 | Winniczek et al. ........ | 438/695 |
| 2010/0167520 A1 | * | 7/2010 | Chen et al. ................. | 438/597 |
| 2010/0176366 A1 | * | 7/2010 | Fu et al. ..................... | 257/4 |

FOREIGN PATENT DOCUMENTS

| | | |
|---|---|---|
| JP | 6-151383 | 5/1994 |
| JP | 2006-190939 | 7/2006 |
| JP | 2008-270803 A | 11/2008 |
| JP | 2009-76555 A | 4/2009 |

* cited by examiner

*Primary Examiner* — Kimberly Rizkallah
*Assistant Examiner* — Caleb Henry
(74) *Attorney, Agent, or Firm* — Rothwell, Figg, Ernst & Manbeck, P.C.

(57) ABSTRACT

A substrate processing method that processes a substrate including a processing target layer, an intermediate layer, and a mask layer as stacked in that order. The intermediate layer includes an Si-ARC (Si-containing Anti-Reflection Coating) film and the mask layer has an opening exposing a part of the Si-ARC. The substrate processing method includes a shrink etching step during which an opening width reduction process and an etching process are performed concurrently. In the opening width reduction process, deposits are formed on a sidewall surface of the opening of the mask layer by a plasma generated from a gaseous mixture of an anisotropic etching gas and one of a depositive gas and $H_2$ gas. And in the etching process, the Si-ARC film forming a bottom portion of the opening are etched.

26 Claims, 7 Drawing Sheets

SUBSTRATE PROCESSING WITH SHRINK ETCHING STEP

CROSS-REFERENCE TO RELATED APPLICATIONS

This application claims priority to Japanese Patent Application No. 2009-038046 filed on Feb. 20, 2009, the entire contents of which are incorporated herein by reference.

FIELD OF THE INVENTION

The present invention relates to a substrate processing method; and, more particularly, to a substrate processing method that processes a substrate having a target layer, an intermediate layer, and a mask layer stacked in that order thereon.

BACKGROUND OF THE INVENTION

There has been known a wafer for a semiconductor device in which an oxide film with impurities, e.g., a TEOS (Tetra Ethyl Ortho Silicate) film, a conductive film, e.g., a TiN film, a BARC (Bottom Anti-Reflection Coating) film, and a photoresist film formed by a CVD (Chemical Vapor Deposition) process or the like have been stacked in that order as a silicon substrate (see, e.g., Japanese Patent Application Publication No. 2006-190939). The photoresist film is formed to have a predetermined pattern by photolithography and serves as a mask upon etching the antireflection film and the conductive film. Besides the aforementioned wafer, another type of wafer has been also known that includes an Si-ARC (Si-containing Anti-Reflection Coating) film located between an etching target film and a photoresist film and serving as a hard mask and antireflection film.

In recent years, as semiconductor devices are manufactured smaller and smaller, there is a need of forming a more precise and minute circuit pattern on the surface of the wafer. To form a minute circuit pattern, the minimum size of a pattern in the photoresist film needs to be smaller in the process of manufacturing a semiconductor device, thus forming a small size of opening (via hole or trench) on a target film subjected to etching.

The minimum size of a pattern in the photoresist film is generally defined by the minimum size capable of being developed by photolithography and the minimum size achievable by photolithography has a limit due to, e.g., aberration in optics. For example, a minimum size attainable by photolithography is about 80 nm. Meanwhile, a processing dimension of about 30 nm is required to satisfy a need of minimizing semiconductor devices.

As the size for meeting a need of minimizing semiconductor devices is becoming smaller and smaller, it is required to develop a technology of forming an opening of such a size complying with the need on a film subjected to etching.

SUMMARY OF THE INVENTION

In view of the above, the present invention provides a substrate processing method that forms an opening, which has a size of meeting the need of minimizing semiconductor devices, on the mask layer or intermediate layer and transfers the opening to a film to be etched.

In accordance with a first embodiment of the present invention, there is provided a substrate processing method that processes a substrate including a processing target layer, an intermediate layer, and a mask layer as stacked in that order, wherein the intermediate layer includes an Si-ARC (Si-containing Anti-Reflection Coating) film and the mask layer has an opening exposing a part of the Si-ARC, the method including: a shrink etching step during which an opening width reduction process and an etching process are performed concurrently, wherein in the opening width reduction process, deposits are formed on a sidewall surface of the opening of the mask layer by a plasma generated from a gaseous mixture of an anisotropic etching gas and one of a depositive gas and $H_2$ gas, and in the etching process, the Si-ARC film forming a bottom portion of the opening are etched.

In accordance with a second embodiment of the invention, there is provided a substrate processing method that processes a substrate including a processing target layer, an intermediate layer, and a mask layer as stacked in that order, wherein the intermediate layer includes an Si-ARC (Si-containing Anti-Reflection Coating) film and the mask layer has an opening exposing a part of the Si-ARC, the method including: a shrink etching step during which an opening width reduction process and an etching process are performed concurrently, wherein in a sacrificial film formation step forming a sacrificial film on a surface of the mask layer and a bottom portion of the opening of the mask layer by a plasma generated from a gaseous mixture of an anisotropic etching gas and one of a depositive gas and $H_2$ gas, in the opening width reduction process, deposits are formed on a sidewall surfaces of the opening of the mask layer by a plasma generated from a mixed gas of a depositive gas and an anisotropic etching gas, and in the etching process, the Si-ARC film and the sacrificial film forming a bottom portion of the opening are etched.

BRIEF DESCRIPTION OF THE DRAWINGS

The features and objects of the present invention will become apparent from the following description of an embodiment given in conjunction with the accompanying drawing, in which.

DETAILED DESCRIPTION OF THE EMBODIMENTS

Hereinafter, embodiments of the present invention will be described in detail with reference to accompanying drawings which from a part thereof.

First of all, there will be described a substrate processing system that fulfils a substrate processing method according to embodiments of the present invention. The substrate processing system includes a plurality of processing modules, each of which performs an etching process on a semiconductor wafer W (hereinafter, simply referred to as "wafer W") as a substrate by using a plasma.

Figure 1:
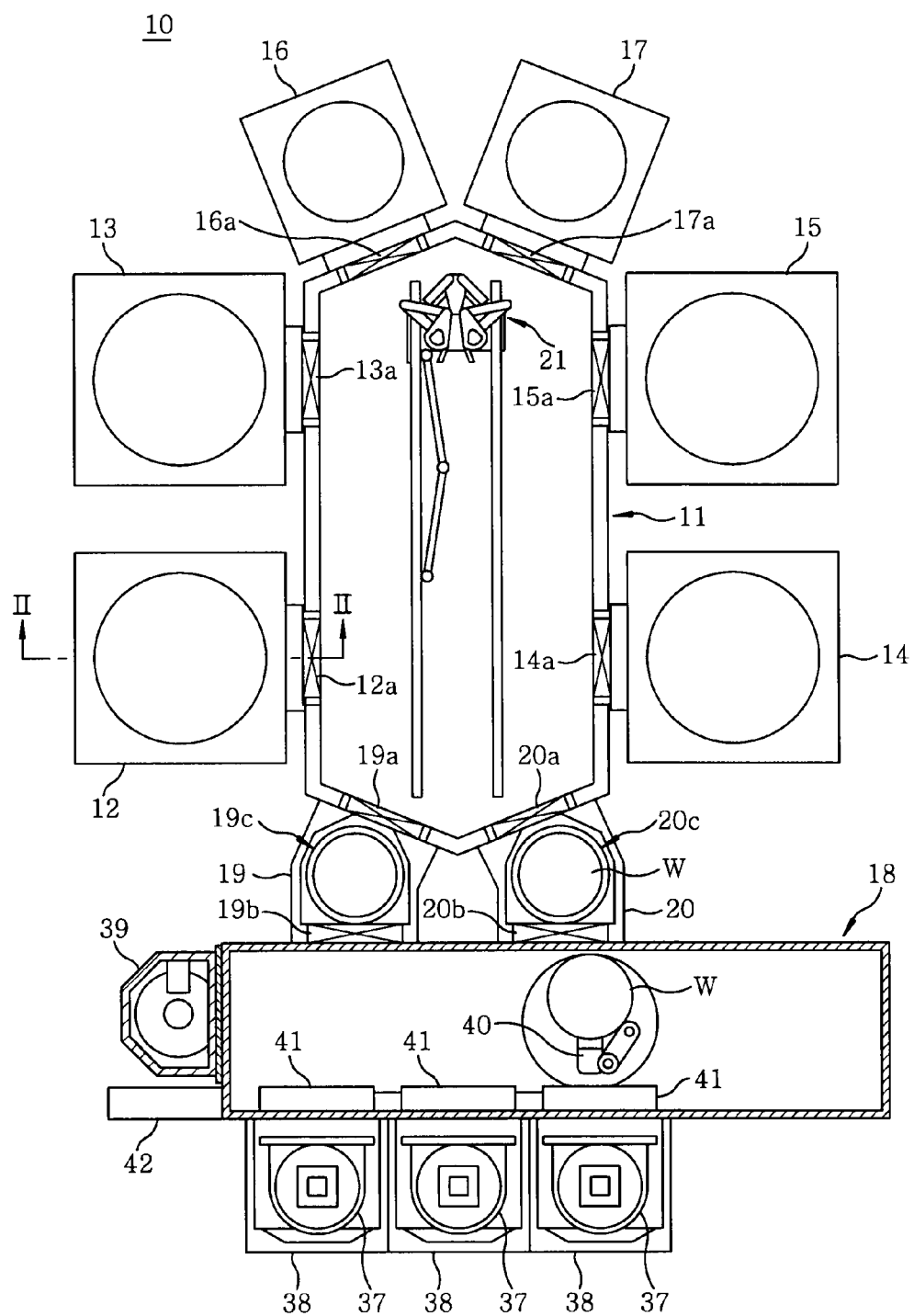
FIG. 1 is a plan view schematically illustrating a configuration of a substrate processing system that performs a substrate processing method according to an embodiment of the present invention.

FIG. 1 is a plan view schematically illustrating a configuration of a substrate processing system that performs a substrate processing method according to an embodiment of the present invention.

Referring to FIG. 1, the substrate processing system 10 includes a transfer module 11 hexagonal in plan view; two process modules 12 and 13 connected to a side surface of the transfer module 11; two process modules 14 and 15 connected to another side surface of the transfer module 11 to face the process modules 12 and 13; a process module 16 connected to the transfer module 11 adjacently to the process module 13; a process module 17 connected to the transfer module 11 adjacently to the process module 15; a loader module 18 as a rectangular transfer chamber; and two load lock modules 19 and 20 arranged between the transfer module 11 and the loader module 18 to connect them to each other.

The transfer module 11 includes therein a transfer arm 21 that is freely extendible/contractible and revolvable. The transfer arm 21 transfers a wafer W between the process modules 12 to 17 or the load lock modules 19 and 20.

The process module 12 includes a processing chamber that receives the wafer W. For example, a mixed gas of $CHF_3$ gas and HBr gas is introduced as a processing gas into the chamber. The introduced processing gas is transformed to plasma by applying an electric field in the chamber. The wafer W is etched using the generated plasma.

Figure 2:
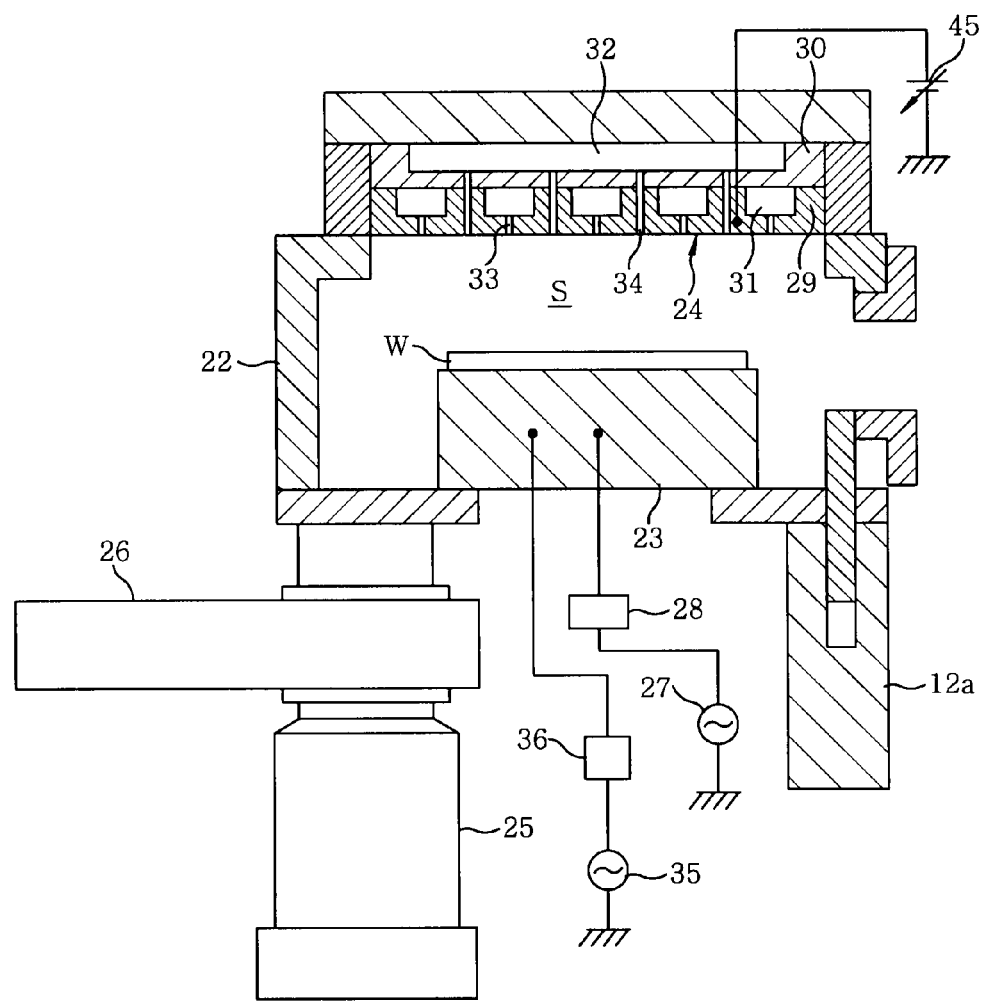
FIG. 2 is a cross sectional view taken along line II-II in FIG. 1.

FIG. 2 is a cross sectional view taken along line II-II in FIG. 1.

Referring to FIG. 2, the process module 12 includes a processing chamber 22, a mounting table 23 arranged inside the chamber 22 to mount the wafer W, a shower head 24 located over the chamber 22 to face the mounting table 23, a TMP (Turbo Molecular Pump) 25 for exhausting gas from the chamber 22, and an APC (Adaptive Pressure Control) valve 26, which is a variable butterfly valve, arranged between the chamber 22 and the TMP 25 to control the pressure inside the chamber 22.

A first high frequency power supply 27 and a second high frequency power supply 35 are connected to the mounting table 23 via a first matcher 28 and a second matcher 36, respectively. The first high frequency power supply 27 applies high frequency power of a relatively high frequency, e.g., 60 MHz, to the mounting table 23 as excitation power, and the second high frequency power supply 35 applies high frequency power of a relatively low frequency, e.g., 2 MHz, to the mounting table 23 as bias power. Accordingly, the mounting table 23 serves as a lower electrode that applies high frequency power to a processing space S between the mounting table 23 and the shower head 24. The matchers 28 and 36 reduce reflection of high frequency power by the mounting table 23 to maximize the efficiency of supplying the high frequency power to the mounting table 23.

The shower head 24 includes a disc-shaped lower gas supply unit 29 and a disc-shaped upper gas supply unit 30 overlapping the lower gas supply unit 29. The lower gas supply unit 29 and the upper gas supply unit 30 includes a first buffer chamber 31 and a second buffer chamber 32, respectively. The first buffer chamber 31 communicates with inside of the chamber 22 via gas vent holes 33 and the second buffer chamber 32 communicates with inside of the chamber 22 via gas vent holes 34.

The first buffer chamber 31 is connected to, for example, a $CHF_3$ gas supply system (not shown). The $CHF_3$ gas supply system supplies $CHF_3$ gas to the first buffer chamber 31. The supplied $CHF_3$ is supplied to the chamber 22 via the gas vent hole 33. The second buffer chamber 32 is connected to, for example, an HBr gas supply system (not shown). The HBr gas supply system supplies HBr gas to the second buffer chamber 32. The supplied HBr gas is supplied to the chamber 22 via the gas vent hole 34.

A DC (Direct Current) power supply 45 is connected to the shower head 24 to apply a DC voltage to the shower head 24. The applied DC voltage controls the distribution of ions in the processing space S.

As described above, the high-frequency power is applied to the processing space S via the mounting table 23 in the chamber 22 of the process module 12 to convert the processing gas supplied from the shower head 24 to the processing space S into high-density plasma, and resultant ions and/or radicals, by which an etching process is performed on the wafer W.

Returning to FIG. 1, the process module 13 includes a processing chamber that receives the wafer W etch processed by the process module 12. A mixed gas of $O_2$ gas and $N_2$ gas is introduced as a processing gas into the chamber in which an electric field is later applied to convert the mixed gas to plasma by which the wafer W is etch processed. The process module 13 has the same configuration as the process module 12. Further, the process module 13 has an $O_2$ gas supply system (not shown) and an $N_2$ or COS gas supply system (not shown) instead of the $CHF_3$ gas supply system (not shown) and the HBr gas supply system (not shown). An ashing process may be also performed in the process module 13 in addition to the etching process.

The process module 14 includes a processing chamber that receives the wafer W etch processed by the process module 13. $O_2$ gas, as a processing gas, is introduced into the chamber of the process module 14, and converted into plasma by generating an electric field inside the chamber. Accordingly, the wafer W is ashing processed by the plasma. The process module 14 also has the same configuration as the process module 12. Further, the process module 14 includes a shower head (not shown) including only a disc-shaped gas supply unit (now shown) whose buffer chamber (not shown) is connected to an $O_2$ gas supply system (not shown) instead of the shower head 24 including the disc-shaped lower gas supply unit 29 and the disc-shaped upper gas supply unit 30.

The insides of the transfer module 11 and the process modules 12 to 17 remain at reduced pressure. The transfer module 11 is connected to the process modules 12 to 17 via vacuum gate valves 12a to 17a, respectively.

In the substrate processing system 10, while the inside of the loader module 18 is maintained at atmospheric pressure, the inside of the transfer module 11 is maintained in a vacuum. Accordingly, the load lock modules 19 and 20 include vacuum gate valves 19a and 20a at a portion that is connected to the process module 11 and atmospheric door valves 19b and 20b at a portion that is connected to the loader module 18, respectively. Thus, the load lock modules 19 and 20 are configured as a vacuum preliminary transfer chamber whose inner pressure can be controlled. Further, the load lock modules 19 and 20 include wafer mounting tables 19c and 20c, respectively, to temporarily mount the wafer W transferred between the loader module 18 and the transfer module 11.

Besides the load lock modules 19 and 20, for example, three FOUP ("Front Opening Unified Pod") mounting tables 38 and an orienter 39 are connected to the loader module 18 as well. A FOUP 37, which is a substrate receiving vessel for receiving, e.g., 25 wafers W therein, is mounted in each FOUP mounting table 38. The orienter 39 pre-aligns the position of the wafer W unloaded from the FOUP 37.

The load lock modules 19 and 20 are connected to a lengthwise side wall of the loader module 18 and arranged to face the three FOUP mounting tables 38, with the loader module 18 therebetween. The orienter 39 is disposed at a longitudinal end portion of the loader module 18.

The loader module 18 includes a SCARA type dual-arm transfer arm 40 serving as a substrate transfer unit that transfers a wafer W arranged in the loader module 18 and three loading ports as input ports of the wafer W that are arranged at a side wall of the loader module 18 correspondingly to the respective FOUP mounting tables. The transfer arm 40 takes out the wafer W from the FOUP 37 mounted on the FOUP mounting table 38 via the load port 41 and transfers the taken wafer W between the load lock modules 19 and 20 or the orienter 39.

The substrate processing system 10 further includes an operation panel 42 that is arranged at a longitudinal end portion of the loader module 18. The operation panel 42 may include a state displaying unit, such as LCD (Liquid Crystal Display), which displays operational conditions of each component included in the substrate processing system 10.

Figure 3:
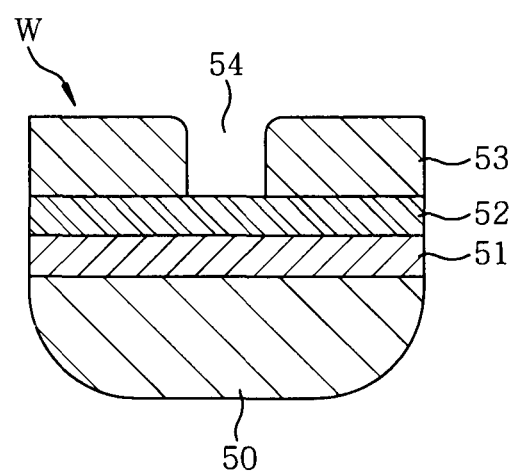
FIG. 3 is a cross sectional view schematically illustrating a construction of a semiconductor wafer to be plasma processed in the substrate processing system shown in FIG. 1.

FIG. 3 is a cross sectional view schematically illustrating a construction of a semiconductor wafer to be plasma processed in the substrate processing system shown in FIG. 1

Referring to FIG. 3, the wafer W includes an amorphous carbon film 51, as a target layer, formed on a surface of a silicon base 50 an Si-ARC (Si containing Anti-Reflection Coating) film (intermediate layer) 52 formed on the amorphous carbon film 51, and a photoresist film (mask layer) 53 formed on the Si-ARC film 52.

The silicon base 50 is a disc-shaped thin plate made of silicon. The amorphous carbon film 51 is formed on the surface of the silicon base 50, e.g., by a CVD process. The amorphous carbon film 51 functions as a lower resist film. The Si-ARC film 52 is formed on the surface of the amorphous carbon film 51 by a coating process. The Si-ARC film 52 functions as a hard mask and anti-reflection film. More specifically, the Si-ARC film 52 contains a colorant that absorbs a ray having a specific wavelength, e.g., an excimer laser beam radiated on the photoresist film 53, and prevents the excimer laser beam transmitted through the photoresist film 53 from being reflected by the Si-ARC film 52 to reach the photoresist film 53. The photoresist film 53 is formed on the Si-ARC film 52, e.g., by a spin coater (not shown). The photoresist film 53 is made of a positive type photosensitive resin, and if illuminated with an excimer laser beam, transformed to be alkali-soluble.

In the wafer W as configured above, the photoresist film 53 is subjected to excimer laser irradiation by a stepper (not shown) to have a predetermined inverted pattern so that a part of the photoresist film 53 irradiated with the excimer laser beam is transformed to be alkali-soluble. Thereafter, a strong alkali developing solution is dropped onto the photoresist film 53 to remove the part transformed as alkali-soluble. That is, the part of the photoresist film 53 corresponding to the inverted pattern is eliminated from the photoresist film 53, thereby leaving a predetermined pattern on the wafer W. For example, the photoresist film 53 having an opening 54 remains at a location where a via hole is formed.

To satisfy needs of small semiconductor devices, it is necessary to stably form an opening (via hole or trench) of a small size, specifically whose CD (Critical Dimension) value is on the order from 20 nm to 30 nm, on the film to be etched. However, since the minimum dimension that may be achieved by photolitograph is on the order of, e.g., 80 nm, it is impossible to form on an etching target film an opening with a CD value enough to meet the need to minimize semiconductor devices in the etching process of the wafer W.

The inventors made various experiments to find a method that forms on the wafer W an opening with a size satisfying the need of minimizing semiconductor devices and came to the following conclusions: if a shrink process is performed to shrink the width of an opening formed on the photoresist film of the wafer W, a deposit is deposited on the bottom portion of the opening as well as on side wall surfaces of the opening; the deposit deposited on the bottom portion of the opening is thicker corresponding to the thickness of the deposit deposited on the side wall surfaces of the opening and thus the deposit deposited on the bottom portion of the opening is varied depending on the difference in original width of the opening; and the deposit deposited on the bottom portion of the opening is different in thickness and thus even though the same etching process is performed on the deposit at the bottom portion, it is impossible to uniformly bore the deposit deposited on the bottom portion.

Based on the above conclusions, various considerations were made by the inventors to reach the present invention. That is, when a plasma process is performed using both a depositive gas prone to deposit a deposit on the side wall surfaces of the opening and an anisotropic etching gas, which is difficult to diffuse toward the side wall surfaces of the opening while etching the bottom portion of the opening and suppressing the deposit from being deposited on the bottom portion of the opening, the width of the opening of the photoresist film may be lessened while it may be simultaneously avoided to deposit the deposit on the bottom portion of the opening, thus forming on a film located at the bottom portion of the opening an opening whose width corresponds to the reduced width of the opening.

FIGS. 4A to 4E depict processes of the substrate processing method according to a first embodiment of the present invention.

Figure 4A:
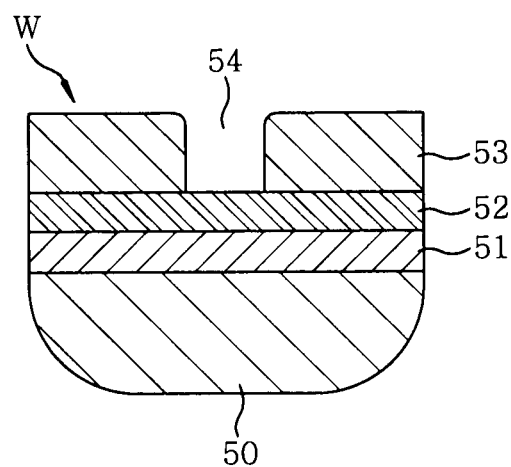
FIGS. 4A to 4E are a flowchart illustrating a substrate processing method according to a first embodiment of the present invention.

Referring to FIG. 4A, a wafer W is prepared that includes an amorphous carbon film 51 serving as a lower resist film on the silicon base 50, the Si-ARC film 52 and the photoresist film 53 as a hard mask and antireflection film on this order, and the photoresist film 53 has the opening 54 whose width is, for example, 60 nm, to partially expose the Si-ARC film 52. Then, the wafer W is loaded in the chamber 22 of the process module 12 (refer to FIG. 2) and mounted on the mounting table 23.

Next, a pressure in the chamber 22 is set, for example, around $2 \times 10$ Pa (150 mTorr) by the APC valve 26 or the like. And a temperature of the wafer W is set, for example, around 60° C. Further $CHF_3$ gas is supplied from the lower gas supply unit 29 of the shower head 24 into the chamber 22 at the flow rate of 200 sccm while $CF_3I$ gas is simultaneously supplied from the upper gas supply unit 30 into the chamber 22 at the flow rate of 50 sccm. At this time, the flow rate of $CHF_3$ and $CF_3I$ is 4 to 1. High frequency power of 750 W is applied to the mounting table 23 as excitation power while high frequency power of 300 W is applied to the mounting table 23 as bias power. Further, a DC voltage of −300V is applied to the shower head 24.

Figure 4B:
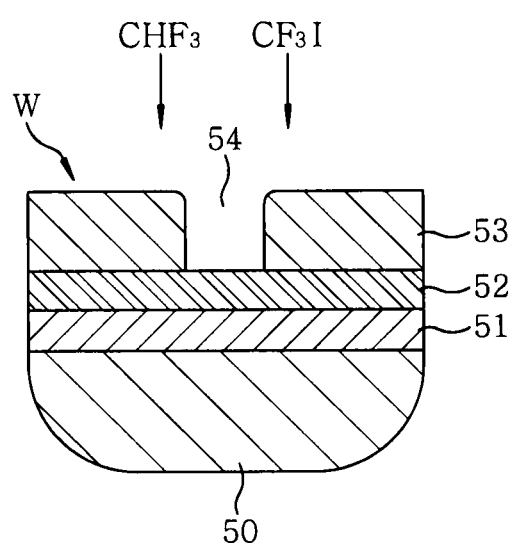
Figure 4C:
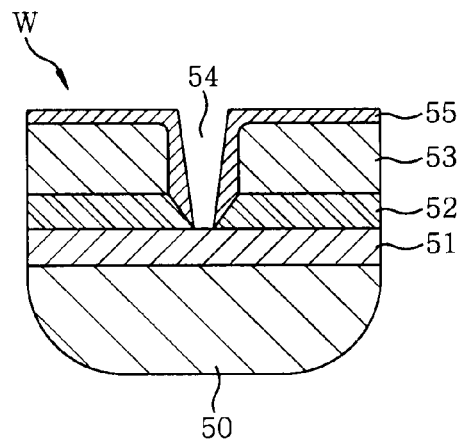

At this time, $CHF_3$ gas and $CF_3I$ gas are converted to plasma by the high frequency power applied to the processing space S, thereby generating ions or radicals (FIG. 4B). The ions or radicals generated from $CHF_3$ gas collide and react with the surface of the photoresist film 53 or the side wall surface of the opening 54 to deposit a deposit 55, which causes the width of the opening 54 to be narrowed. The deposit 55 is prone to be deposited on the bottom portion of the opening 54, as well. The deposit 55 is removed by anisotropic etching using the ions or radicals generated from $CF_3I$ gas. Further, because of containing Si, the Si-ARC film 52 is readily etched by the ions or radicals generated from $CF_3I$ gas. Accordingly, the bottom surface of the opening of the Si-ARC film 52 is etched while the width of the opening 54 is reduced due to the deposition of the deposit on the side wall surface of the opening 54 shrink etching step). The deposition speed of deposit deposited on the side wall surfaces of the opening 54 is balanced with the etching speed of the Si-ARC film 52 abutting the bottom portion of the opening, and the opening 54 is tapered as going down in terms of the shape of its cross section, i.e. the width of the opening is reduced as goes down. Thus, there is formed on the Si-ARC film 52 an opening whose end portion is further reduced in width than the opening 54 of the photoresist film 53 (FIG. 4C).

The Si-ARC film 52 continues to be etched until the amorphous carbon film 51, as a lower resist film, is exposed. There is formed on the Si-ARC film 52 an opening whose width is reduced to, for example, 27 nm.

The wafer W with reduced width of opening 54 and etched Si-ARC film 52 is unloaded from the chamber 22 of the process module 12, loaded in the chamber of the process module 13 via the transfer module 11, and mounted on the mounting table.

Figure 4D:
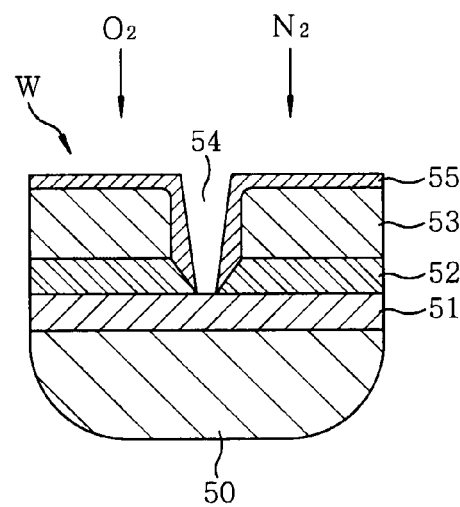
Figure 4E:
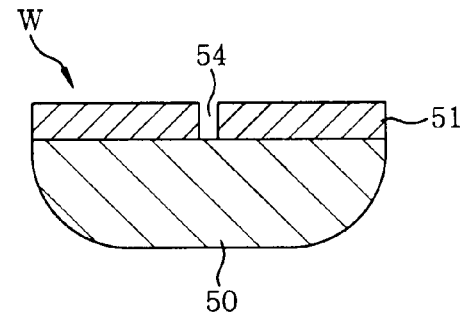

Next, a pressure in the chamber 22 is set, for example, around 2.6 Pa (20 mTorr) by the APC valve 26 or the like. Then, $O_2$ gas is supplied at the flow rate of 180 sccm from the lower gas supply unit of the shower head 24 to the chamber while $N_2$ or COS gas is simultaneously supplied at the flow rate of 20 sccm from the upper gas supply unit to the chamber. Thereafter, excitation power of 1000 W is applied to the mounting table 23 and bias power is adjusted to 0 W. $O_2$ gas and $N_2$ gas (COS gas) are converted into plasma by the high frequency power, thus generating ions or radicals (FIG. 4D). The ions or radicals collide and react with a portion of the amorphous carbon film 51 which is not covered by the deposit 55 deposited on the photoresist film 53 and the side wall surfaces of the opening 54 and the Si-ARC film 52, thus etching the portion. Until the silicon base 50 is exposed, the amorphous carbon film 51 is etched so that there is formed on the amorphous carbon film 51 an opening whose width is, for example, 25 nm. At the moment, the photoresist film 53, the deposit 55 deposited on the surface of the photoresist film 53 and the side wall surfaces of the opening 54, and the Si-ARC film 52 are simultaneously removed (FIG. 4E).

Thereafter, the wafer W is unloaded from the chamber of the process module 13, and this process ends.

The wafer W in which the amorphous carbon film 51 includes the opening 54 with shrunk width is separately etched using a known process, thus allowing the wafer W to have an opening of an intended pattern dimension.

In this embodiment, the shrink etching step used $CHF_3$ gas as a depositive gas, which easily deposits a deposit on the side wall surfaces of the opening 54; $CF_3I$ gas, as an anisotropic etching gas, to suppress the deposit from being deposited on the bottom surface of the opening 54 and to readily etch a base layer. Thus, the width of the opening of the photoresist film 53 could be reduced and the reduced width of opening permitted etching of the Si-ARC film 52 which was not covered by the photoresist film 53 and the deposit 55. That is, the shrink step of reducing the width of opening 54 and the etching step of etching the Si-ARC film 52 based on the reduced width of opening may be performed as one step approach which allows for satisfying the recent need of minimizing semiconductor devices as well as improving productivity.

In this embodiment, because of containing Si, the Si-ARC film 52 is more readily etched by ions generated from $CF_3I$ gas rather than, for example, the BARC film not including Si. Thus, the speed of etching the Si-ARC film 52 is faster than the speed of sufficiently depositing the deposit 55 on the side wall surfaces of the opening 54, and after the shrink etching step, the cross section of the opening 54 is thus shaped as being tapered such that the width of the opening is progressively decreased in a downward direction.

The width of the opening formed on the Si-ARC film 52 is determined on a ratio of the etching speed of the Si-ARC film 52 abutting the bottom portion of the opening 54 with respect of the deposition speed of the deposit 55 deposited on the side wall surfaces of the opening 54 of the photoresist film 53. That is, a mixing ratio of $CHF_3$ gas as a depositive gas and $CF_3I$ gas as an anisotropic etching gas is adjusted to control the etching speed of the Si-ARC film 52 of the bottom portion of the opening 54 respective of the deposition speed of the deposit 55, thereby making it possible to slightly adjust the width of the opening formed on the Si-ARC film 52. In this embodiment, the mixing ratio of $CHF_3$ gas may be greater than the mixing ratio of $CF_3I$ gas in order to reduce the width of the opening 54 and form an opening with a reduced width on the Si-ARC film 52.

In this embodiment, the depositive gas used for the shrink etching step is represented as general formula "CxHyFz (x, y, and z are 0 or a positive integer), and for example, $CHF_3$ gas may be used as the depositive gas. Besides $CHF_3$ gas, for example, $CH_3F$ gas, $C_5F_8$ gas, and $C_4F_6$ gas may also be used as the depositive gas.

On the other hand, $CF_3I$ gas may be appropriately used as the anisotropic etching gas. $CF_3I$ gas may be more readily treated than, for example, HBr gas, because of being less poisonous. Besides $CF_3I$ gas, for example, $CF_3Br$ gas, $CF_3At$ gas, HI gas, and HBr gas may be used as the anisotropic etching gas. Further, instead of halogen elements, sulfur (S) or any element that belongs to Group 16 of the periodic table and has a larger atomic weight than sulfur may be used as the anisotropic etching gas. A gas containing a halogenated element thereof or an element belonging to Group 16 of the periodic table has a low volatility and thus is seldom diffused in the horizontal direction of the opening. Thus, such a gas is one that may generate plasma etching the base layer without depositing a deposit on the bottom portion of the opening. This gas may be used in combination with a depositive gas. The plasma generated from the anisotropic etching gas has a lower volatility, and accordingly, reacts with carbon to form a bonding film, thus protecting side surfaces of the opening 54. Further, the plasma is considered to be diffused toward the bottom portion of the opening by ion energy to thereby etch the Si-ARC film 52.

In accordance with this embodiment, the bias power used in the shrink etching step is 100 W to 500 W. If the bias power is lower than 100 W, the bottom portion of the opening is insufficiently etched. On the other hand, if the bias power exceeds 500 W, the photoresist film 53 is roughened due to sputtering.

In this embodiment, a pressure in the chamber during an etching process may be 2.6 Pa (20 mTorr) to 2×10 Pa (150 mTorr), more specifically, 1×10 Pa (75 mTorr) to 2×10 Pa (150 mTorr). If the process pressure is excessively low, the surface of the substrate is roughened. On the other hand, if the process pressure is too high, the surface of the substrate is worn.

In this embodiment, a temperature of the wafer W during an etching process, although not particularly limited, may be 20° C. to 100° C.

In this embodiment, the target layer is the amorphous carbon film 51 as a lower resist film. However, the target layer is not limited thereto. For example, a $SiO_2$ film or TiN film may be used as the target layer.

In this embodiment, the shrink etching step of etching the Si-ARC film while reducing the width of the opening 55 at the same time and the etching step of etching the amorphous carbon film 51 may be sequentially performed in the same chamber.

In this embodiment, although a mixing gas of a depositive gas and an anisotropic etching gas was used as a process gas in the shrink etching step, a mixed gas of an anisotropic etching gas and $H_2$ gas may be also used. If the anisotropic etching gas and $H_2$ gas are supplied into the chamber of the process module, for example, part of $CF_3I$ gas as the anisotropic etching gas and $H_2$ gas react with each other, F of $CF_3I$ gas is released as HF gas and thus F is reduced from some of $CF_3I$ gas to serve as a depositive gas. Specifically, a reaction production gas between $CF_3I$ gas and $H_2$ gas and unreacted $CF_3I$ gas are converted into plasma by high frequency power applied to the processing space S, thus generating ions or radicals by which the above-described shrink etching step may be performed.

A second embodiment of the present invention will now be described.

In this embodiment, a sacrificial film of a CF-based deposit is first formed on the photoresist film 53 of the wafer shown in FIG. 3 and then the shrink etching step as in the first embodiment is performed.

FIGS. 5A to 5F depict processes of the substrate processing method according to a second embodiment of the present invention.

Figure 5A:
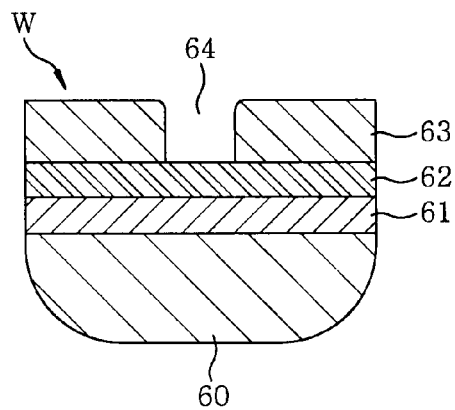
FIGS. 5A to 5F are a flowchart illustrating a substrate processing method according to a second embodiment of the present invention.
Figure 5B:
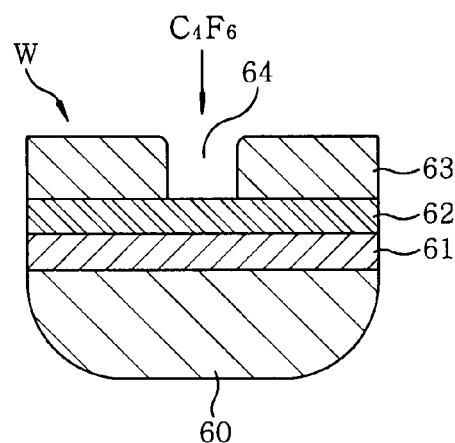

Referring to FIG. 5A, the wafer W is prepared that includes an amorphous carbon film 61 serving as a lower resist film on the silicon base 60, the Si-ARC film 62 and the photoresist film 63 as a hard mask and antireflection film on this order, and the photoresist film 63 has the opening 64 whose width is, for example, 60 nm, to partially expose the Si-ARC film 62. Then, the wafer W is loaded in the chamber 22 of the process module 12 (refer to FIG. 2) and mounted on the mounting table 23.

Figure 5C:
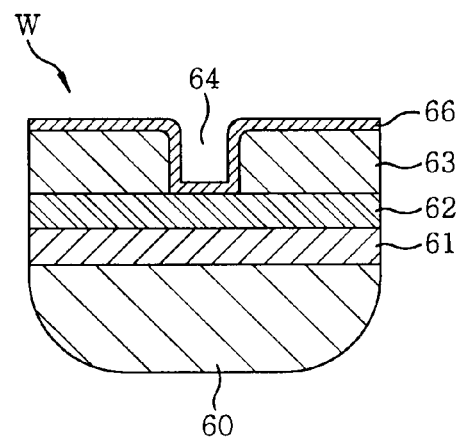

Next, a pressure in the chamber 22 is set, for example, around 2.6 Pa (20 mTorr) by the APC valve 26 or the like. And, $C_4F_6$ gas is supplied as a depositive gas from the lower gas supply unit 29 of the shower head 24 to the chamber 22 at the flow rate of 30 sccm. Then, excitation power of 1000 W and bias power of 0 W are applied to the mounting table 23 while a DC voltage of −600 V is simultaneously applied to the shower head 24. $C_4F_6$ gas is excited by the high frequency power applied to the processing space S and $C_4F_6$ gas is converted into plasma, thus generating ions or radicals (FIG. 4B). The ions or radicals collide and react with the bottom portion of the opening 64 to deposit a deposit, thus forming a sacrificial film 66 (FIG. 5C).

A pressure in the chamber 22 in which the wafer W having the sacrificial film 66 formed on the photoresist film 63 is set, for example, around 2×10 Pa (150 mTorr) by the APC valve 26 or the like. Also, a temperature of the wafer W is set, for example, at 50° C.

$CHF_3$ gas is supplied at the flow rate of 200 sccm from the lower gas supply unit 29 of the shower head 24 to the chamber 22 while $CF_3I$ gas is simultaneously supplied at the flow rate of 50 sccm from the upper gas supply unit 30 to the chamber 22. In addition, high frequency power of 750 W as excitation power and power of 300 W as bias power are supplied to the mounting table 23 at the same time. Further, a DC voltage of −300 V is applied to the shower head 24.

Figure 5D:
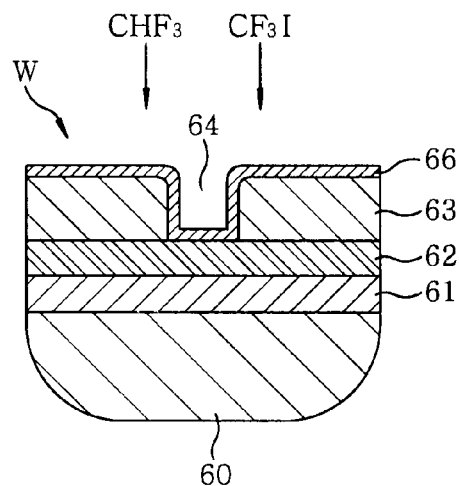

Then, $CHF_3$ gas and $CF_3I$ gas are converted into plasma by the high frequency power applied to the processing space S, thus generating ions or radicals (FIG. 5D). The ions or radicals generated from $CHF_3$ gas collide and react with the surface of the sacrificial film 66 on the photoresist film or side wall surfaces of the opening 64 to deposit a deposit 65 which is in turn integrated with the sacrificial film 66, thus narrowing the width of the opening. At this moment, the deposit 65 is also prone to be deposited on the bottom portion of the opening 64. And, the ions generated from $CF_3I$ gas are seldom diffused in the direction of the side surfaces of the opening 64 and thus travel toward the bottom portion of the opening 64 rather than colliding with the deposit deposited on the side wall surfaces of the opening 64. These ions collide with the deposit positioned at the bottom portion of the opening 64, thus removing the deposit and etching the Si-ARC film 62 and the sacrificial film 66 that form a base layer.

That is, the ions or radicals generated from $CHF_3$ gas cooperate with the ions or radicals generated from $CF_3I$ gas and thus shrink the width of the opening 64 while simultaneously etching the Si-ARC film 62 and the sacrificial film 66 located at the bottom portion of the opening, which is not covered by the deposit 65 deposited on the photoresist film 63 and the side wall surfaces of the opening of the photoresist film 63 (shrink etching step).

Figure 5E:
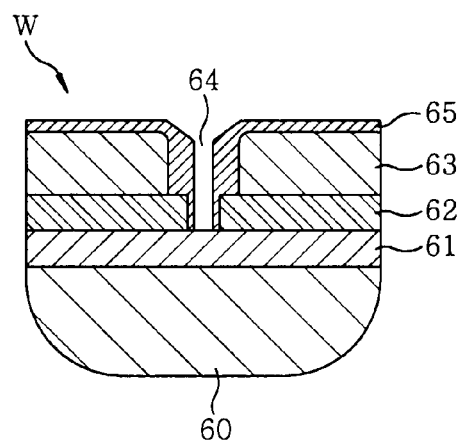

The etching speed of the Si-ARC film 62 is faster than that of, for example, a BARC film that does not contain Si. Unless the sacrificial film 66 is provided beforehand, the etching of the Si-ARC film 62 may be performed faster than the deposition of the deposit 65 that shrinks the width of the opening 64, and thus the Si-ARC film 62 may be bored so that the cross section of the opening may be tapered. In this embodiment, since the sacrificial film 66 is previously formed on the surface of the photoresist film 63, the etching speed of the bottom portion of the opening 64 is retarded due to the sacrificial film 66. By doing so, the deposit is deposited on the side wall surfaces of the opening 64 while the sacrificial film 66 at the bottom portion of the opening and the Si-ARC film 62 are simultaneously etched. Accordingly, at the time the etching of the sacrificial film 66 and the Si-ARC film 62 is nearly completed, there is formed on the Si-ARC film 62 the opening that is substantially vertical and reduced to a predetermined width (FIG. 5E).

Figure 5F:
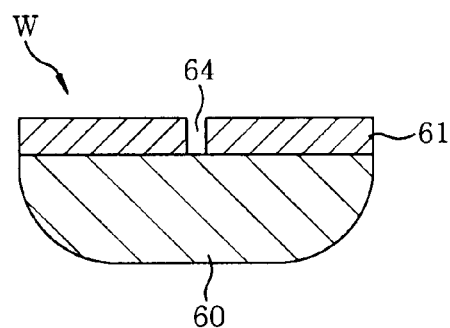

The wafer W in which the width of the opening 64 has been reduced and the Si-ARC film 62 has been etched is unloaded from the chamber 22 of the process module 12, and loaded in the chamber of the process module 13 via the transfer module 11. Then, as in the first embodiment, the amorphous carbon film 61 is etched using the Si-ARC film 62 as a hard mask. More specifically, a portion of the amorphous carbon film 61 which is not covered by the Si-ARC film 62, the photoresist film 63, and the deposit 65 deposited on the opening of the photoresist film 63 is etched. At the moment, the photoresist film 63, the deposit 65 deposited on the opening of the photoresist film 63, and the Si-ARC film 62 are all ashed (FIG. 5F). The amorphous carbon film 61 is formed with an opening whose width is, for example, 30 nm. The wafer W in which the amorphous carbon film 61 formed with the opening 64 of reduced width is separately etched by a known process, thus completing the wafer W to have an opening of a desired size.

In this embodiment, the sacrificial film 66 of a CF-based deposit is formed on the surface of the photoresist film 63 before the shrink etching step is performed that reduces the width of the opening 64 while simultaneously etching the Si-ARC film 62 at the bottom portion of the opening 64. In the subsequent shrink etching step, accordingly, the speed of deposition of deposit which reduces the width of the opening 64 may be harmonized with the speed of etching the bottom portion of the opening 64, so that the opening with a reduced width may be formed on the Si-ARC film 62, an intermediate layer, for transferring to the target film. Further, a recent need of minimizing semiconductor devices may be satisfied and productivity of the wafer W may be raised.

In the second embodiment, which is different from the first embodiment, the opening 64 may be formed so that its top portion and bottom portion have a substantially uniform width without being tapered. Based on the pattern of the opening 64, an opening pattern that does show any bowing shape and is substantially vertical may be transferred to the silicon base 60 and the amorphous carbon film 61 that is a target layer.

In this embodiment, the thickness of the sacrificial film 66 formed prior to the shrink etching step may be adjusted to control the ratio of the width of the opening formed on the Si-ARC film 62 respective of the width of the opening 64 formed on the photoresist film 63, that is, a shrink ratio of opening width.

In this embodiment, the depositive gas used in the sacrificial film formation step and the shrink etching step may be represented as general formula $C_xH_yF_z$ (x, y, and z are are 0 or a positive integer). For example, $CHF_3$ gas, $CH_2F_2$ gas, $CH_3F$ gas, $C_5F_8$ gas, $C_4F_6$ gas, or $C_4F_8$ gas may be used as the depositve gas. In the shrink etching step, $CHF_3$ gas may be appropriately used as the depositive gas.

In this embodiment, a gas containing Br or a halogen element having a greater atomic number than Br, carbon, and fluorine is used as an anisotropic etching gas. Especially, $CF_3I$ gas or $CF_3Br$ gas may be appropriately used. Besides, $CF_3At$ gas, HI gas, or HBr gas or the like may be used as the anisotropic gas. In the etching gas, further, the halogen element may be replaced by sulfur (S) or an element having a greater molecular weight than sulfur (S) which belongs to Group 16 of the periodic table.

In this embodiment, the ratio of the speed of etching the Si-ARC film 62 and the sacrificial film 66 at the bottom portion of the opening 64 respective of the speed of depositing the deposit on the side wall surfaces of the opening 64 of the photoresist film 63 may rely on the mixing ratio of the depositive gas and the anisotropic etching gas. In the earlier part of the shrink etching step that primarily reduces the width of the opening, the mixing ratio of the depositive gas may be adapted to be greater than the mixing ratio of the anisotropic etching gas. In the latter part of the shrink etching step that mainly focuses on formation of the opening whose width has been reduced on the Si-ARC film 62, on the other hand, the mixing ratio of the anisotropic etching gas may be adapted to be greater than the mixing ratio of the depositive gas. Further, the shrink etching step may be performed in two steps by changing the gas mixing ratio.

In this embodiment, the bias power during the etching process is 100 W to 500 W. If the bias power is less than 100 W, the bottom portion of the opening 64 is insufficiently etched. On the other hand, the bias power in excess of 500 W causes the photoresist film 63 to be roughened due to sputtering.

In this embodiment, a pressure in the chamber during the etching process may be 2.6 Pa (20 mTorr) to 2×10 Pa (150 mTorr), more specifically, 1×10 Pa (75 mTorr to 2×10 Pa (150 mTorr). An excessive low process pressure may cause the surface of the substrate to be roughened. On the other hand, a too high process pressure may lead to wear of the surface of the substrate. A temperature of the wafer W may be, but not particularly limited to, 20° C. to 100° C.

In this embodiment, the target layer is the amorphous carbon film 61 as a lower resist film, but not limited thereto. For example, a $SiO_2$ film or TiN film may be used as the target layer.

In this embodiment, the shrink etching step that reduces the width of the deposit 55 while simultaneously etching the Si-ARC film 62 and the step of etching the amorphous carbon film 61 while simultaneously ashing the film on the amorphous carbon film 61 may be continuously performed in the same chamber.

In this embodiment, a mixed gas of the depositive gas and the anisotropic etching gas is used as a processing gas in the shrink etching step. However, the present invention is not limited thereto. For example, $H_2$ gas may be used instead of the depositive gas and the shrink etching step may be performed by a mixed gas of the anisotropic etching gas and $H_2$ gas as in the first embodiment.

The substrate subjected to a plasma treatment according to the embodiments of the present invention is not limited to a wafer for semiconductor devices, but may include various substrates used for LCDs (Liquid Crystal FPD (Flat Panel Displays), or the like, or photomasks, CD substrates, PCBs (Print Circuit Boards) or the like.

Moreover, an aspect of the present invention may be also achieved by a storage medium storing program codes of software for implementing the functions of the above-mentioned embodiments, which is supplied to a system or device whose computer (or CPU or MPU) may read and execute the program codes stored in the storage medium.

In this case, the program codes themselves, which are read from the storage medium, realize the functions of each of the above-described embodiments, and the program codes and the storage medium storing the program codes configure the present invention.

Further, the storage medium for supplying program codes may include, for example, floppy discs (registered trademark), hard discs, magneto-optical discs, optical discs, such as CD-ROMs, CD-Rs, CD-RWs, DVD-ROMs, DVD-RAMS, DVD-RWs, and DVD+RWs, magnetic tapes, non-volatile memory cards, and ROMs. Or, the program codes may be downloaded over a network.

The functions of each of the above-described embodiments may be implemented by executing the program codes read by the computer, or by actual processes whose part or entirety is executed by OS (Operating System) operating in the computer based on commands of the program codes.

The program codes read from the storage medium may be recorded in a memory provided in a function extension board inserted in the computer or a function extension unit connected to the computer. The functions of each of the above-described embodiments may be implemented by actual processes of an extension function whose part or entirety is executed by a CPU provided in the extension board or extension unit based on commands of the program codes.

While the invention has been shown and described with respect to the embodiments, it will be understood by those skilled in the art that various changes and modifications may be made without departing from the scoped of the invention as defined in the following claims.

What is claimed is:

1. A substrate processing method that processes a substrate including a processing target layer, an intermediate layer, and a mask layer as stacked in that order, wherein the intermediate layer includes an Si-ARC (Si-containing Anti-Reflection Coating) film and the mask layer has a first opening exposing a part of the Si-ARC film, the method comprising:
    a shrink etching step during which an opening width reduction process and an etching process are performed concurrently,
    wherein in the opening width reduction process, deposits are formed on a sidewall surface of the first opening of the mask layer by a plasma generated from a gaseous mixture of an anisotropic etching gas and one of a depositive gas and $H_2$ gas, wherein in the etching process performed concurrently with the opening width reduction process, the Si-ARC film forming a bottom portion of the first opening is etched to form a second opening extending through the Si-ARC film to expose the target layer, and further wherein during said shrink etching step deposits are foamed on a sidewall surface of said Si-ARC film in said second opening such that upon completion of said shrink etching step deposits are on the sidewall surface of the first opening through the mask layer and deposits are also on the sidewall surface of the second opening through the Si-ARC film;

wherein the target layer is an amorphous carbon film; and the method further comprising, after said shrink etching step, performing an etching step through said second opening to etch said amorphous carbon film exposed through said second opening.

2. The substrate processing method of claim 1, wherein the gaseous mixture is formed of the anisotropic etching gas and the depositive gas, and the depositive gas is a gas represented as $C_xH_yF_z$, each of x, y, and z being 0 or a positive integer.

3. The substrate processing method of claim 2, wherein, the depositive gas is $CHF_3$ gas.

4. The substrate processing method of claim 1, wherein the gaseous mixture is formed of the anisotropic etching gas and the depositive gas and the anisotropic etching gas is a gas that contains bromine (Br), a halogen element with a greater atomic number than bromine (Br), sulfur (S), or an element that belongs to Group 16 of the periodic table having a greater atomic number than sulfur (S).

5. The substrate processing method of claim 4, wherein the anisotropic etching gas is $CF_3I$ gas, $CF_3Br$ gas, $CF_3At$ gas, HI gas, or HBr gas.

6. The substrate processing method of claim 1, wherein the gaseous mixture is formed of the anisotropic etching gas and the $H_2$ gas.

7. The substrate processing method of claim 6, wherein the gaseous mixture is formed of the anisotropic etching gas and the $H_2$ gas, and in the shrink etching step, a mixing ratio of the $H_2$ gas and the anisotropic etching gas is adjusted to control a ratio of an etching rate of a film forming the bottom portion of the first opening to a deposition rate at the sidewall surface of the first opening.

8. The substrate processing method of claim 1, wherein the gaseous mixture is formed of the anisotropic etching gas and the depositive gas, and in the shrink etching step, a mixing ratio of the depositive gas and the anisotropic etching gas is adjusted to control a ratio of an etching rate of the Si-ARC (Si containing Anti-Reflection Coating) film forming the bottom portion of the first opening to a deposition rate at the sidewall surface of the first opening.

9. The substrate processing method of claim 1, wherein during the shrink etching step, $CHF_3$ is used as the depositive gas, and the anisotropic etching gas is a gas that contains bromine (Br), a halogen element with a greater atomic number than bromine (Br), sulfur (S), or an element that belongs to Group 16 of the periodic table having a greater atomic number than sulfur (S).

10. The method of claim 1, wherein during the shrink etching step, a bias power of 100 W to 500 W is applied, and wherein the shrink etching step is performed at a pressure of 20 mTorr to 150 mTorr.

11. A substrate processing method according to claim 1, wherein in the opening width reduction process deposits are formed directly on the mask layer on the sidewall surface thereof.

12. A substrate processing method of claim 11, wherein the amorphous carbon film as the target layer is positioned immediately below the Si-ARC film.

13. A substrate processing method according to claim 12, wherein the amorphous carbon film is positioned on a silicon substrate with the silicon substrate immediately below the amorphous carbon film.

14. A substrate processing method according to claim 1, wherein the amorphous carbon film is positioned immediately below the Si-ARC film, and wherein the amorphous carbon film is positioned on a silicon substrate with the silicon substrate immediately below the amorphous carbon film.

15. A substrate processing method that processes a substrate including a processing target layer, an intermediate layer, and a mask layer as stacked in that order, wherein the processing target layer comprises an amorphous carbon film, the intermediate layer includes an Si-ARC (Si-containing Anti-Reflection Coating) film and the mask layer has an opening exposing a part of the Si-ARC film, the method comprising:

a sacrificial film formation step of forming a sacrificial film on a surface of the mask layer and on the part of the Si-ARC film exposed at a bottom portion of the opening of the mask layer by a plasma, a shrink etching step performed after the sacrificial film formation step and during which an opening width reduction process and an etching process are performed concurrently, wherein in the opening width reduction process, deposits are formed on sidewall surfaces of the opening of the mask layer by a plasma generated from a mixed gas of the depositive gas and the anisotropic etching gas and wherein the anisotropic etching gas is a gas that contains bromine (Br), a halogen element with a greater atomic number than bromine (Br), sulfur (S), or an element that belongs to Group 16 of the periodic table having a greater atomic number than sulfur (S), and wherein in the etching process performed concurrently with the opening width reduction process, the Si-ARC film and the sacrificial film formed on the Si-ARC film at the bottom portion of the opening are both etched; and wherein the opening in the mask layer is a first opening, and wherein in the etching process performed concurrently with the opening width reduction step, a second opening is etched through the Si-ARC film to expose the amorphous carbon film.

16. The substrate processing method of claim 15, wherein, the depositive gas is $CHF_3$ gas.

17. The substrate processing method of claim 15, wherein the anisotropic etching gas is $CF_3I$ gas, $CF_3Br$ gas, $CF_3At$ gas, HI gas, or HBr gas.

18. The substrate processing method of claim 15, wherein the gaseous mixture is formed of the anisotropic etching gas and the $H_2$ gas.

19. The substrate processing method of claim 18, wherein the gaseous mixture is formed of the anisotropic etching gas and the $H_2$ gas, and in the shrink etching step, a mixing ratio of the $H_2$ gas and the anisotropic etching gas is adjusted to control a ratio of an etching rate of a film forming the bottom portion of the opening to a deposition rate at the sidewall surface of the opening.

20. The substrate processing method of claim 15, wherein the gaseous mixture is formed of the anisotropic etching gas and the depositive gas, and in the shrink etching step, a mixing ratio of the depositive gas and the anisotropic etching gas is adjusted to control a ratio of an etching rate of the Si-ARC (Si containing Anti-Reflection Coating) film forming the bottom portion of the opening to a deposition rate at the sidewall surface of the opening.

21. The substrate processing method of claim 15, and further wherein during said shrink etching step deposits are formed on a sidewall surface of said Si-ARC film in said second opening such that upon completion of said shrink etching step deposits are on the sidewall surface of the first opening through the mask layer and deposits are also on the sidewall surface of the second opening through the Si-ARC film.

22. The substrate processing method of claim 21, further including, after said shrink etching step, performing an etching step through said second opening to etch said amorphous carbon film exposed through said second opening.

23. The substrate processing method of claim 15, wherein during the shrink etching step $CHF_3$ is used as the depositive gas, and further wherein during the sacrificial film formation step a plasma is formed with a depositive gas different than the depositive gas used during the shrink etching step.

24. The substrate processing method of claim 23, wherein the depositive gas used for the sacrificial film formation step includes $C_4F_6$.

25. A substrate processing method according to claim 15, wherein the amorphous carbon film is positioned immediately below the Si-ARC film.

26. A substrate processing method according to claim 25, wherein the amorphous carbon film is positioned on a silicon substrate with the silicon substrate immediately beneath the amorphous carbon film.

* * * * *